(12) United States Patent
Nakajima

(10) Patent No.: US 8,188,589 B2
(45) Date of Patent: May 29, 2012

(54) SUBSTRATE WITH PIN, MANUFACTURING METHOD THEREOF, AND SEMICONDUCTOR PRODUCT

(75) Inventor: Shigeo Nakajima, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 786 days.

(21) Appl. No.: 12/107,966

(22) Filed: Apr. 23, 2008

(65) Prior Publication Data
US 2008/0296752 A1 Dec. 4, 2008

(30) Foreign Application Priority Data
Apr. 27, 2007 (JP) .................................. 2007-119040

(51) Int. Cl.
*H01L 23/48* (2006.01)
(52) U.S. Cl. ......... 257/697; 257/E23.024; 257/E23.067; 257/E23.174
(58) Field of Classification Search .................. 257/697, 257/E23.105, E23.024, E23.06, E23.067, 257/E23.068, E23.174; 174/267; 361/791
See application file for complete search history.

(56) References Cited

U.S. PATENT DOCUMENTS
2009/0233465 A1* 9/2009 Mizoguchi ...................... 439/74

FOREIGN PATENT DOCUMENTS

| JP | 62-242348 | 10/1987 | |
|---|---|---|---|
| JP | 62-247555 | 10/1987 | |
| JP | 64-42579 | * 2/1989 | ............... 427/443.1 |
| JP | 02-002151 | 1/1990 | |
| JP | 03-177056 | 8/1991 | |
| JP | 7-169876 | 7/1995 | |
| JP | 07-169876 | 7/1995 | |
| JP | 09-129778 | 5/1997 | |
| JP | 9-129778 | 5/1997 | |
| JP | 11-103001 | 4/1999 | |
| JP | 2000-022019 | 1/2000 | |
| JP | 2000-22019 | 1/2000 | |
| JP | 2001-250882 | 9/2001 | |
| JP | 2004-228595 | 8/2004 | |

* cited by examiner

Primary Examiner — Jasmine Clark
(74) Attorney, Agent, or Firm — Drinker Biddle & Reath LLP

(57) ABSTRACT

A semiconductor product is constructed of a wiring substrate in which pads for pin connection are formed, and a substrate with pins in which pins are disposed. The substrate with the pins is formed so that one end of the pin is exposed to one surface of a resin substrate formed by resin molding and the other end of the pin extends from the other surface of the resin substrate and one end of the pin is bonded to a pad of the wiring substrate through a conductive material.

10 Claims, 14 Drawing Sheets

SUBSTRATE WITH PIN, MANUFACTURING METHOD THEREOF, AND SEMICONDUCTOR PRODUCT

This application claims priority to Japanese Patent Application No. 2007-119040, filed Apr. 27, 2007, in the Japanese Patent Office. The Japanese Patent Application No. 2007-119040 is incorporated by reference in its entirety.

TECHNICAL FIELD

The present disclosure relates to a substrate with a pin used in a PGA (Pin Grid Array) type semiconductor device, a preferred manufacturing method of the substrate with the pin, and a semiconductor product using the substrate with the pin.

RELATED ART

A PGA type semiconductor device has an advantage that the semiconductor device can be mounted by only inserting a pin into a socket and the need for a complicated step of mounting by solder reflow as described in a BGA type semiconductor device is eliminated, and an advantage that a product can be replaced by only reinserting the product from the socket, and is used in various electronic products.

The PGA type semiconductor device includes a product manufactured by disposing a through hole for pin attachment in a wiring substrate and attaching a pin to the through hole, and a product manufactured by bonding a pin to a pad for pin bonding disposed on the mounting surface side of a wiring substrate.

When a through hole is disposed in a wiring substrate and a pin is attached, the wiring substrate acts as a support body of the pin, so that the wiring substrate itself needs to have a certain amount of strength and there are many cases of being formed by comprising a core substrate for reinforcement. Similarly, when a PGA type semiconductor device is formed by bonding a nail head of a pin to a pad for bonding, a wiring substrate having a predetermined strength by, for example, disposing a core substrate has been used in order to prevent deformation such as warping of the wiring substrate.

However, in recent years, thinning and miniaturization of a semiconductor device are desired and a thickness (for example, 1 mm or less) of a wiring substrate has become extremely thin. As a result of this, a core substrate for reinforcement cannot be disposed inside the wiring substrate and the wiring substrate does not hold a sufficient strength, so that warping of the wiring substrate in the case of solder reflow becomes a problem.

FIG. 15 shows an example of a PGA type package in which pins 7 are bonded to pads 6 disposed in a wiring substrate 5. In the case of forming this package, after solder pastes 8 are applied to the pads 6 of the wiring substrate 5, the wiring substrate 5 and the pins 7 are supported by a support jig and are carried in a reflow apparatus together with the support jig and the pins 7 are bonded to the pads 6 by solder. FIGS. 16A and 16B show a step of bonding pins 7 to a wiring substrate 5 using a support jig 9. This reflow step has a following problem. When the support jig 9 and the wiring substrate 5 carried out of a reflow apparatus reach about room temperature, the support jig 9 is removed from the wiring substrate 5. However, when the wiring substrate 5 warps, the pin 7 inclined by the warping catches in a pin insertion hole 9a of the support jig 9 and the support jig 9 cannot be removed from the wiring substrate 5. When the support jig 9 is removed forcibly, a product is damaged.

In addition, a following configuration of the PGA type package has been proposed (for example, Patent References 1 to 3). That is, a substrate with pins in which pins are attached to a substrate is prepared separately from a wiring substrate and the substrate with pins is bonded to the wiring substrate and thereby a bonding strength of the pins is held and also the wiring substrate can be densified.

[Patent Reference 1] Japanese Patent Application Publication No. 7-169876
[Patent Reference 2] Japanese Patent Application Publication No. 9-129778
[Patent Reference 3] Japanese Patent Application Publication No. 2000-22019

However, in the case of a PGA type semiconductor product constructed by bonding a substrate with pins to the wiring substrate described above, work for boring holes in a substrate and inserting pins into the substrate and brazing the pins to the substrate is required in order to form the substrate with the pins. Therefore, there is a problem that a step of manufacturing the substrate with the pins is complicated. Also, since it is configured to be attached by brazing the pins to the substrate, it is necessary to select a brazing material for brazing the pins to the substrate with the pins so as to withstand a temperature in the case of bonding the substrate with the pins to the wiring substrate by solder. Therefore, there is also a problem that material selection of the brazing material is restricted.

SUMMARY

Exemplary embodiments of the present invention provide a substrate with a pin in which even in the case of using an easy-to-deform wiring substrate with a thin thickness, a PGA type semiconductor product can be manufactured surely and easily and the manufacture is also easy, a preferred manufacturing method of this substrate with the pin, and a semiconductor product using this substrate with the pin.

The exemplary embodiments comprise the following configuration.

That is, a semiconductor product comprises a wiring substrate having a pad for pin connection, and a substrate having a resin substrate formed by resin molding and a pin disposed in the resin substrate, the pin having one end exposed to one surface of the resin substrate and bonded to the pad of the wiring substrate through a conductive material and the other end extending from the other surface of the resin substrate. Herein, one end of the pin refers to a concept including an upper end face of the pin, a connection projection, and a head part formed in the pin.

The semiconductor product is provided by being constructed as a semiconductor device in which a semiconductor element is mounted on the wiring substrate and also, is provided by being constructed as a semiconductor package in which a semiconductor element mounting part is disposed in the wiring substrate.

Also, one end of the pin is formed flush with one surface of the resin substrate and thereby, it is provided as a thin compact semiconductor product.

Also, one end of the pin protrudes from one surface of the resin substrate and also a head part whose diameter is formed larger than that of a shaft part of a pin is formed in one end of the pin and thereby, bonding between the pin and the pad can be improved.

Also, one end of the pin is formed in the same diameter as that of a shaft part of the pin and thereby, the pins can be arranged at a high density and it can cope with high-density arrangement of pads and an increase in pins of a wiring substrate.

Also, a connection projection is formed in one end of the pin and thereby, bonding between the pin and the pad can be improved. Also, a locking part is formed in a middle part of a shaft part of the pin and buried in the resin substrate and thereby, the pin can surely be supported in the resin substrate.

Also, a reinforcing material is disposed on a surface opposite to a surface, to which the substrate with the pin is bonded, of the wiring substrate and thereby, stress occurring by a difference between the wiring substrate and the substrate with the pin in a physical property value is reduced and reliability of a semiconductor product can be improved.

Also, a substrate comprises a resin substrate formed by resin molding, a pin disposed in the resin substrate, the pin having one end exposed to one surface of the resin substrate and the other end extending from the other surface of the resin substrate.

Various forms in which one end of the pin is formed flush with one surface of the resin substrate and one end of the pin protrudes from one surface of the resin substrate and a head part whose diameter is formed larger than that of a shaft part of a pin is formed in one end of the pin and one end of the pin is formed in the same diameter as that of a shaft part of the pin and a connection projection is formed in one end of the pin and a locking part is formed in a middle part of a shaft part of the pin and buried in the resin substrate can be taken as the substrate with the pin. Therefore, the pin is surely bonded to the pad for pin bonding formed on the wiring substrate and it is provided as a semiconductor product comprising the pin for connection.

Also, a manufacturing method of a substrate comprising a resin substrate and a pin disposed in the resin substrate, the method comprises steps of, setting the pin in a lower mold in a state that one end of the pin is protruded from a resin molding surface of the lower mold and the other end of the pin is inserted into a set hole of the lower mold, abutting an upper mold on the one end of the pin set in the lower mold to form a cavity for resin molding by the lower mold and the upper mold, and filling the cavity with a resin and curing the resin to form the resin substrate by resin molding.

Also, it is characterized in that the upper mold is abutted on the one end of the pin set in the lower mold through a film.

Also, it is characterized in that when the upper mold is abutted on the one end of the pin, the one end of the pin is pushed in the film and the resin is molded without infiltrating the resin on the one end of the pin to manufacture the substrate in which the one end of the pin is protruded from an outer surface of the resin substrate.

Also, it is characterized in that the pin is a pin having a flange formed in a middle part of a shaft part of the pin, and the flange is abutted on the resin molding surface of the lower mold when the pin is set in the lower mold, and infiltration of a resin into the set hole is suppressed and the resin is molded.

Since a semiconductor product according to the invention is formed by bonding a substrate with a pin to a wiring substrate, the wiring substrate is supported by shape retention of the substrate with the pin and a necessary strength can be held as the whole semiconductor product. Also, it can be provided as a pin grid array type semiconductor product having a necessary pin bonding strength by connecting one end of the pin to a pad for connection formed on the wiring substrate through a conductive material such as solder. Also, the substrate with the pin according to the invention can preferably be used in manufacture of these semiconductor products and also, the substrate with the pin can easily be manufactured according to a manufacturing method of the substrate with the pin according to the invention.

Other features and advantages may be apparent from the following detailed description, the accompanying drawings and the claims.

DETAILED DESCRIPTION

A preferred embodiment of the invention will hereinafter be described in detail with reference to the accompanying drawings.

(Substrate with Pin)

FIGS. 1A to 1D show a manufacturing method of a substrate with pins according to the invention. The substrate with the pins according to the invention is formed in a form erected by aligning pins 10 with a substrate molded in a flat plate shape by a molding resin in predetermined arrangement.

Figure 1A:
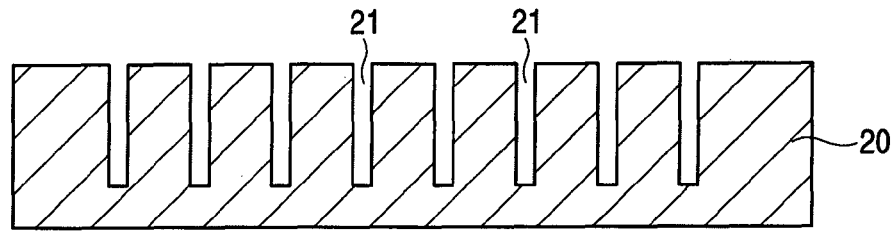
FIGS. 1A to 1D are explanatory views showing a manufacturing method of a substrate with pins according to the invention.

FIG. 1A shows a lower mold 20 of a metal mold for molding in which the pins 10 are supported in a predetermined array. Multiple set holes 21 for supporting the pins 10 in alignment with a plane array of the pins 10 in the substrate with the pins are formed in the lower mold 20. The set hole 21 is formed in an inside diameter in which a shaft part of the pin 10 is slid. In the pin 10 attached to the substrate with the pins, an outside diameter of a head part 10a is about 0.75 mm and an outside diameter of the shaft part is about 0.3 mm.

Figure 1B:
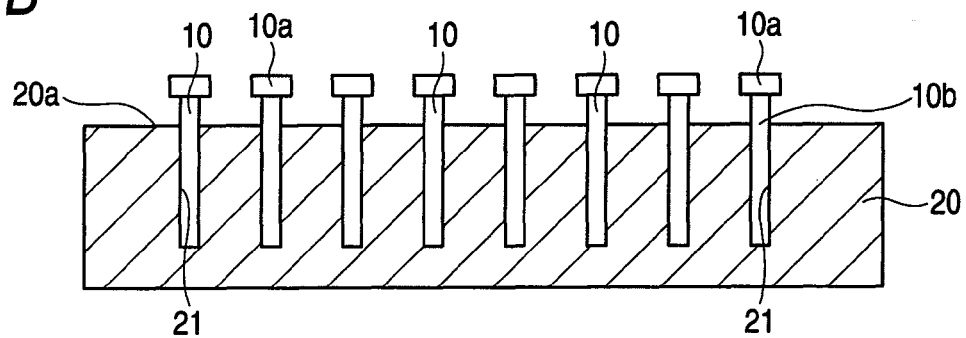

FIG. 1B shows a state of setting the pins 10 in the lower mold 20. The pin 10 of the illustrated example comprises the circular head part 10a in which the diameter is formed larger than that of the shaft part 10b and the end face (top surface) is formed in a flat surface in an upper part of the shaft part 10b. The pin 10 is set so as to insert the shaft part 10b into the set hole 21.

By inserting the shaft part 10b of the pin 10 into the set hole 21, the pin 10 is supported in a state in which the lower end of the shaft part 10b abuts on the bottom of the set hole 21 and the head part 10a is somewhat upward separate from an upper surface (resin molding surface 20a) of the lower mold 20.

Figure 1C:
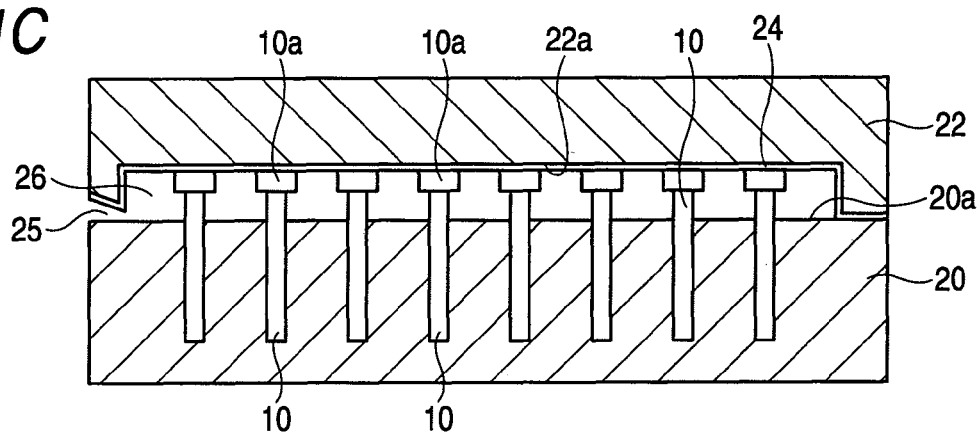
Figure 1D:
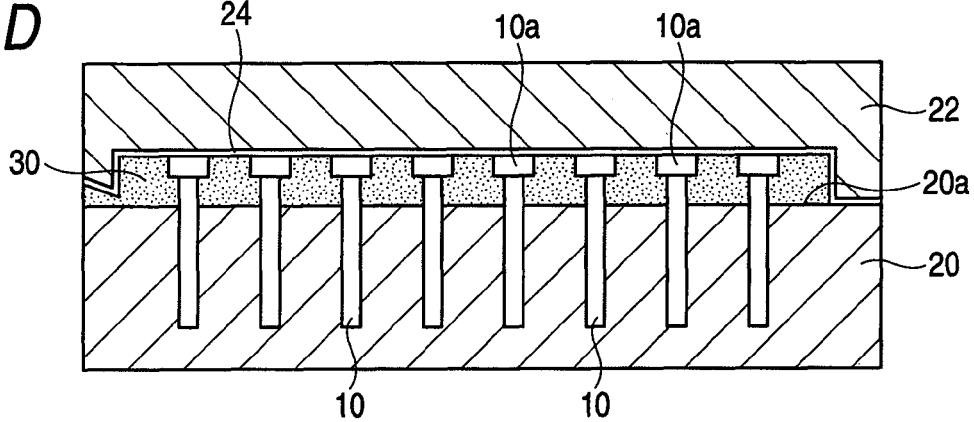

FIGS. 1C and 1D are a step of arranging an upper mold 22 with the upper mold opposed to the lower mold 20 in which the pins 10 are set and molding a resin. As shown in FIG. 1C, a surface (resin molding surface 22a) of the upper mold 22 opposed to the lower mold 20 is formed in a flat surface. The resin molding surface 22a of the upper mold 22 is covered with a film 24 for molding and end faces of the head parts 10a of the pins 10 are abutted on the film 24 and the pins 10 are clamped by the upper mold 22 and the lower mold 20 and thereby, a cavity 26 is formed. The cavity 26 is filled with a resin from a molding gate 25 disposed in communication with the cavity 26.

Materials (for example, PTFE, ETFE, PET, FEP films, a fluorine-impregnated glass cloth, a polypropylene film, Poly vinylidene chloride-PVDC) having heat resistance capable of withstanding a heating temperature of a molding metal mold and extensibility and flexibility for being easily deformed following an inner surface of the cavity of the molding metal mold and easily peeled from a resin and a metal mold surface are preferably used in the film 24 for molding. Also, the film for molding is adsorbed by air to the upper mold 22 so as to follow the inner surface of the cavity and a resin is molded and also, in a state of evacuating the inside of the cavity 26 and reducing a pressure of the inside of the cavity 26, the cavity 26 is filled with a resin for molding and the resin is molded. By reducing the pressure of the inside of the cavity 26 and molding the resin, a void can be prevented from being mixed in the resin to mold the resin.

FIG. 1D shows a state of filling the cavity 26 with a resin 30. The cavity 26 is formed as the closed space and the cavity 26 is filled with the resin 30 at a predetermined pressure and the resin 30 is thermally cured to mold the resin.

Figure 2:
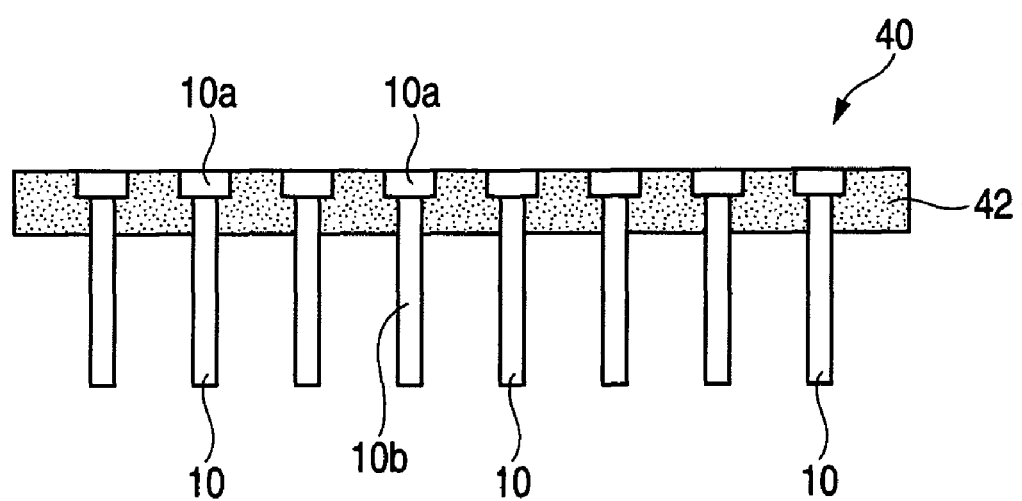
FIG. 2 is a sectional view showing a configuration of the substrate with the pins.

FIG. 2 shows a substrate 40 with pins manufactured by the resin molding operation described above. The substrate 40 with the pins is obtained by molding the resin and then opening the metal mold and releasing a molded product from the lower mold 20 and removing the molded product to the outside of the metal mold.

The substrate 40 with the pins is formed by erecting multiple pins in a resin substrate 42 molded by the resin 30 in a flat plate shape. Since the resin molding surfaces 20a, 22a of the lower mold 20 and the upper mold 22 are formed in flat surfaces, both surfaces of the resin substrate 42 are formed in flat surfaces.

In the pins 10 erected in the substrate 40 with the pins, the head part 10a formed in one end of the pin 10 is sunk in the resin substrate 42 and the other end (shaft part 10b) of the pin 10 extends from the other surface (lower surface) of the resin substrate 42. The other end of the pin 10 forms an external connection terminal inserted into a socket.

The end face (top surface) of the head part 10a of the pin 10 is exposed flush with one surface (surface bonded to a wiring substrate) of the resin substrate 42. The end face of the head part 10a of the pin 10 is pressed on the film 24 and is covered at the time of molding a resin, and the resin 30 is prevented from infiltrating on the end face of the head part 10a at the time of molding the resin, and the end face of the head part 10a is in a state of being surely exposed to one surface of the resin substrate 42.

A thickness of the resin substrate 42 of the substrate 40 with the pins is defined by a thickness of the cavity 26 at the time of molding a resin, in other words, a protrusion dimension (height from the resin molding surface 20a to the end face of the head part 10a) of the pin 10 from the resin molding surface 20a of the lower mold 20 in the case of setting the pins 10 in the lower mold 20. Therefore, a depth of the set hole 21 formed in the lower mold 20 is set in consideration of a thickness of the head part 10a and a length of the shaft part 10b of the pin 10.

The thickness of the resin substrate 42 of the substrate 40 with the pins is about 0.2 to 1.0 mm. The resin substrate 42 of the substrate 40 with the pins is set in thickness capable of obtaining predetermined shape retention in order to suppress deformation of a wiring substrate. The cavity 26 and the set holes 21 are set according to the thickness of this resin substrate 42. An epoxy resin having a predetermined strength or a resin material in which a filler such as alumina or silica for reinforcement is mixed in an epoxy resin is used as a resin material used in the resin substrate 42. Of course, proper resin materials other than the epoxy can be used.

Figure 3A:
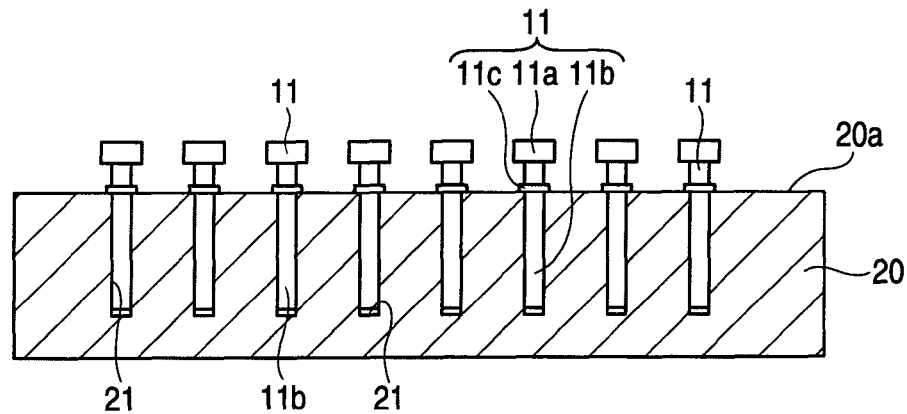
FIGS. 3A to 3C are explanatory views showing a manufacturing method of a substrate with pins.
Figure 3B:
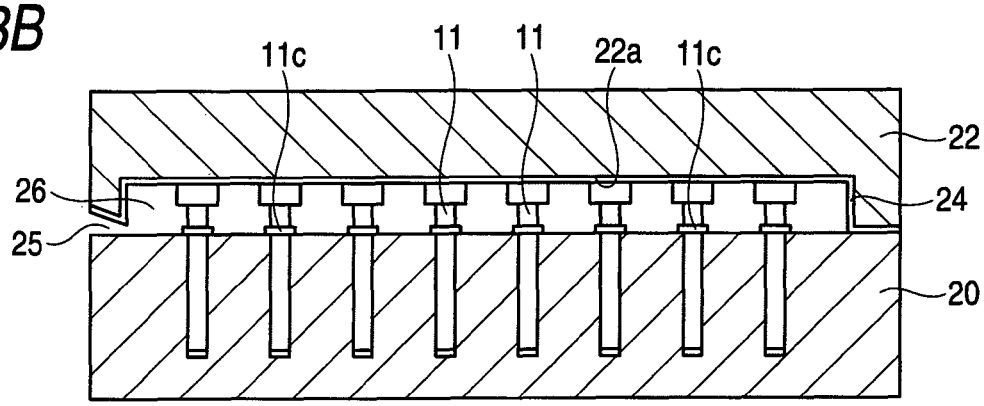
Figure 3C:
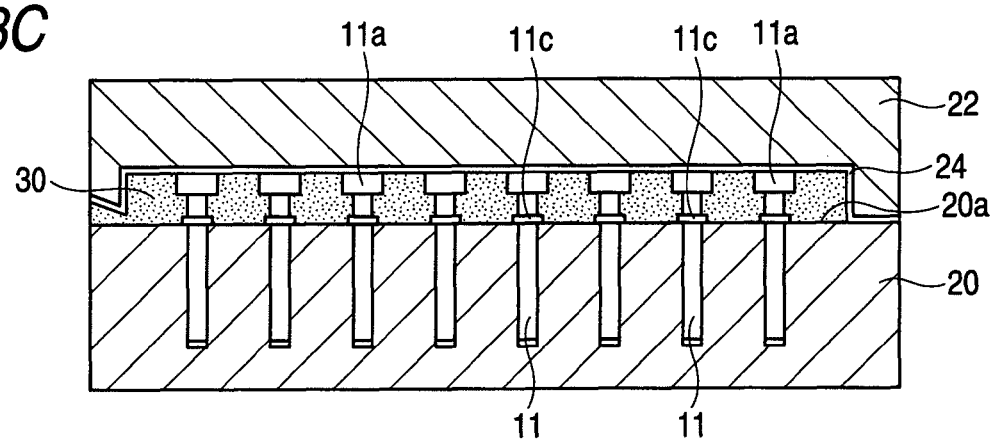
Figure 4:
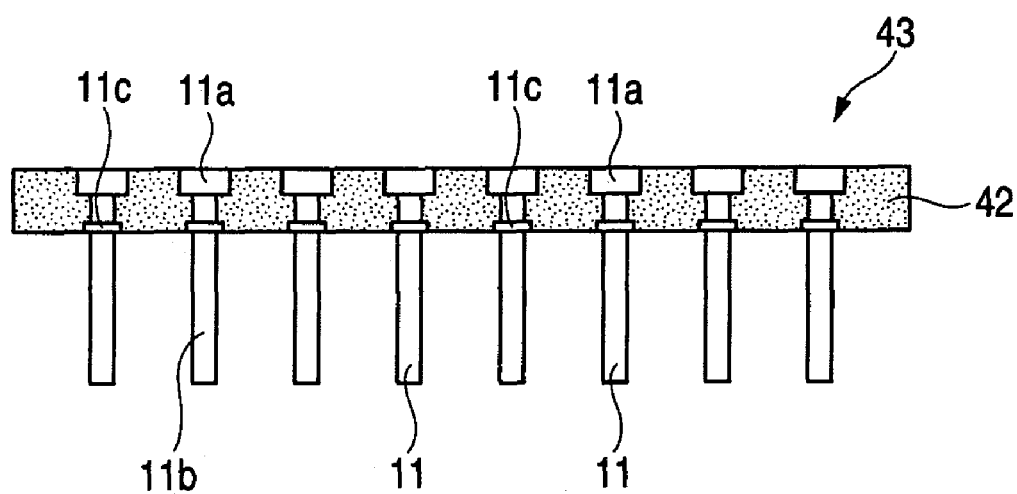
FIG. 4 is a sectional view showing another configuration of the substrate with the pins.

FIGS. 3 and 4 show another manufacturing method of a substrate with pins, and the substrate with the pins obtained by this manufacturing method.

Also in the manufacturing method of the substrate with the pins of the embodiment, set holes 21 into which shaft parts 11b of pins 11 are inserted are disposed in a lower mold 20 and the shaft parts 11b of the pins 11 are inserted into the set holes 21 (FIG. 3A) and a resin molding surface 22a of an upper mold 22 is covered with a film 24 for molding and end faces of head parts 11a of the pins 11 are abutted on the film 24 (FIG. 3B) and a cavity 26 is filled with a resin 30 for molding from a molding gate 25 and the resin is molded (FIG. 3C).

In the embodiment, a characteristic configuration resides in the fact that the pin 11 in which a flange 11c for regulating an insertion position of the pin 11 in the lower mold 20 by abutting on a resin molding surface 20a of the lower mold 20 is disposed in the middle part of the shaft part 11b is used.

By disposing the flange 11c in the shaft part 11b of the pin 11, the vicinity portion of the opening edge of the set hole 21 is closed by the flange 11c in the case of setting the pin 11 in the lower mold 20, so that a situation in which a resin infiltrates into the portion of a gap between the set hole 21 and an outer peripheral surface of the pin 11 in the case of molding the resin can be suppressed and a resin burr is prevented from occurring on an outer peripheral side surface of the shaft part 11b of the pin 11.

In addition, when the pin 11 comprising the flange 11c is used, the amount of protrusion of the pin 11 from the resin molding surface 20a of the lower mold 20 is determined by a position of the flange 11c on the shaft part 11b, so that the set hole 21 formed in the lower mold 20 could be set in a depth in which the lower end of the shaft part 11b does not abut on the bottom of the set hole 21.

In a manner similar to the substrate 40 with the pins described above, also in a substrate 43 with pins of the embodiment as shown in FIG. 4, pins 11 are erected in a resin substrate 42 molded by a resin in a flat plate shape in predetermined arrangement and one end of the pin 11 is flush with an upper surface of the resin substrate 42 and is exposed to one surface (upper surface) of the resin substrate 42 and a lower surface position of the flange 11c is flush with a lower surface position of the resin substrate 42 and the other end (shaft part 11b) of the pin 11 extends from the other surface (lower surface) of the resin substrate 42.

In the substrate 43 with the pins of the embodiment, a head part 11a of the pin 11 and the flange 11c acting as a locking part are molded by a resin so as to be buried in the resin substrate 42, so that the pin 11 is attached to the resin substrate 42 more tightly.

Figure 5A:
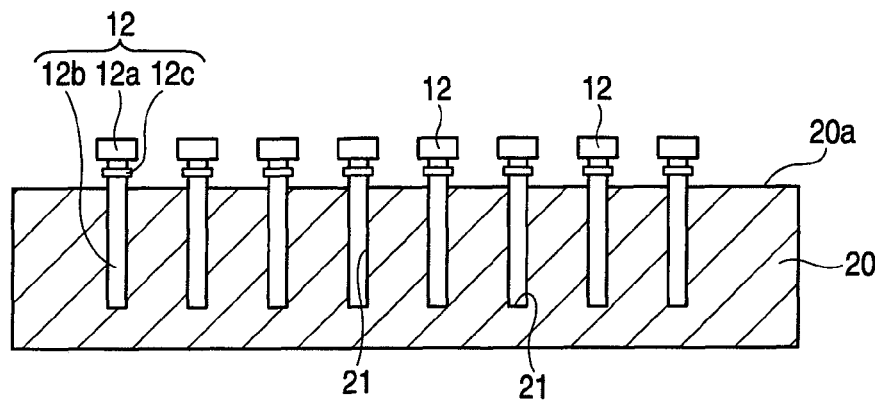
FIGS. 5A to 5C are explanatory views showing a manufacturing method of a substrate with pins.
Figure 5B:
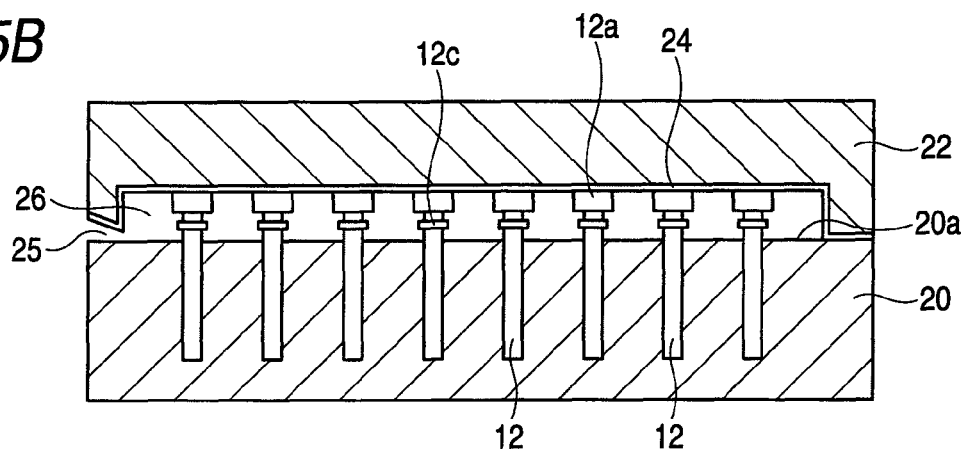
Figure 5C:
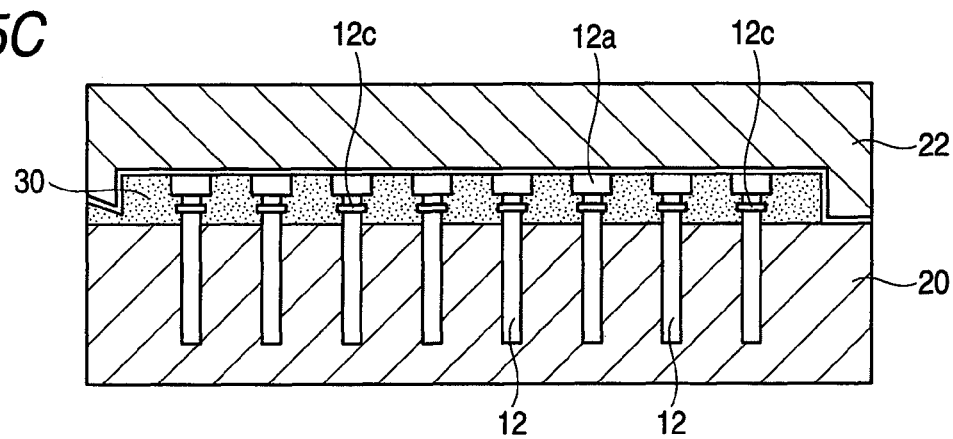
Figure 6:
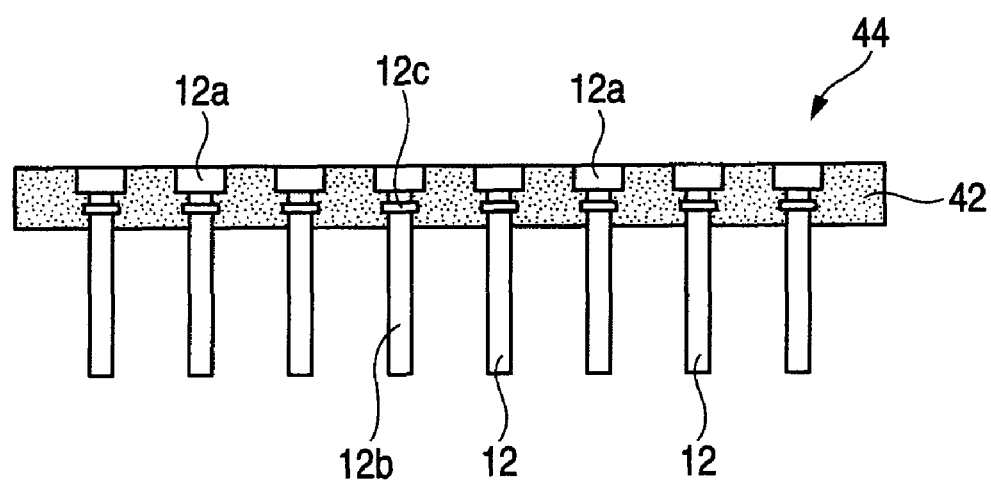
FIG. 6 is a sectional view showing a further configuration of the substrate with the pins.

FIGS. 5 and 6 show a further manufacturing method of a substrate with pins, and the substrate with the pins obtained by this manufacturing method.

The manufacturing method of the substrate with the pins of the embodiment is characterized in that a substrate 44 with pins is formed using pins 12 in which projections 12c acting as locking parts are disposed in the middle parts of shaft parts 12b. Since a resin molding step and a configuration of a lower mold 20 and an upper mold 22 used in resin molding are similar to those of the embodiment described above, the description is omitted.

The projection 12c disposed on the shaft part 12b of the pin 12 is disposed in a position completely buried inside a resin substrate 42 in the case of molding a resin. That is, a position of the projection 12c on the shaft part 12b is designed so that the projection 12c is located in a position upper than a resin molding surface 20a of the lower mold 20 in the case of abutting the lower end of the shaft part 12b on the bottom of a set hole 21 and setting the pin 12 in the lower mold 20.

As shown in FIG. 6, in the substrate 44 with the pins of the embodiment, an end face formed on a flat surface of a head part 12a formed as one end of the pin 12 is arranged flush with an upper surface of the resin substrate 42 and is exposed to one surface (upper surface) of the resin substrate 42 molded in a flat plate shape by resin molding and the other end (shaft part 12b) of the pin 12 extends from the other surface (lower surface) of the resin substrate 42. The projection 12c disposed on the shaft part 12b of the pin 12 is molded by a resin in a state of being completely sunk (buried) inside the resin substrate 42.

When the resin is molded in a form of burying the projection 12c inside the resin substrate 42 as described in the embodiment, the projection 12c acts so as to retain the pin 12 from the resin substrate 42 and the pin 12 can surely be supported in the substrate 44 with the pins.

In addition, it is unnecessary to always form an end face (top surface) of the head part flush with an outer surface of the resin substrate 42 in the case of forming the substrate with the pins by molding the pins comprising the head parts by a resin. In some cases, the resin may be molded so that the top surface of the head part protrudes from the outer surface of the resin substrate 42, or it maybe formed so that the top surface of the head part somewhat retracts from the top surface of the head part and a region of the head part is formed in a concave shape.

When the top surface of the head part is protruded from the outer surface of the resin substrate 42, it can also be constructed so that the top protrudes by forming the top of the head part in a circular conic shape or the top protrudes by forming the top of the head part in a spherical curved surface in addition to a form of protruding the top surface of the head part in a state of a flat surface. In order to partially protrude the head part from the outer surface of the resin substrate 42, a resin could be molded so that the resin does not infiltrate into the top of the head part by pushing the top of the head part in the film 24 in the case of clamping the pin by the lower mold 20 and the upper mold 22. When the amount of protrusion protruding from the outer surface of the resin substrate 42 becomes large, a resin is molded by selecting a thickness of the film 24 used according to the amount of protrusion of the head part, for example, thickening the thickness of the film 24.

Figure 7A:
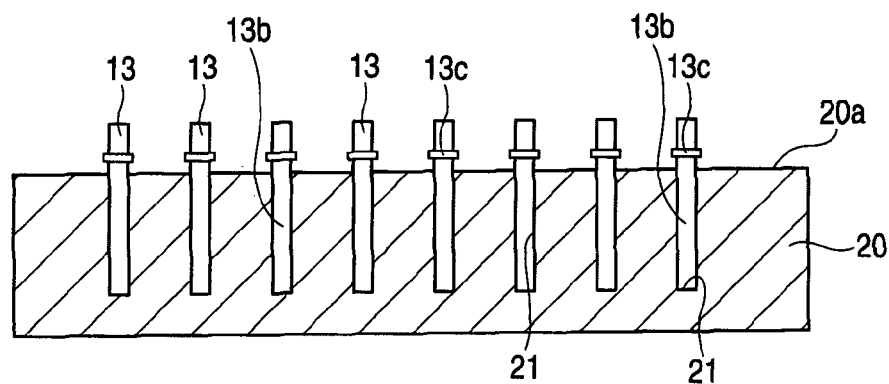
FIGS. 7A to 7C are explanatory views showing a manufacturing method of a substrate with pins.
Figure 7B:
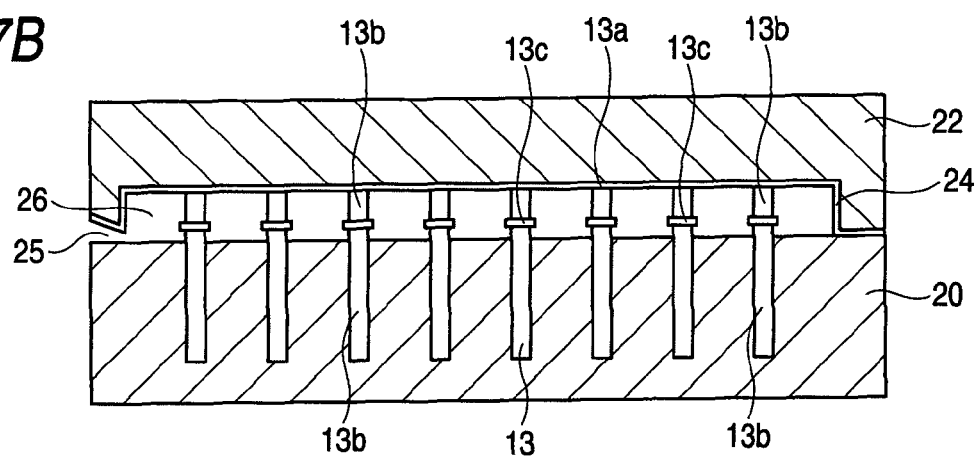
Figure 7C:
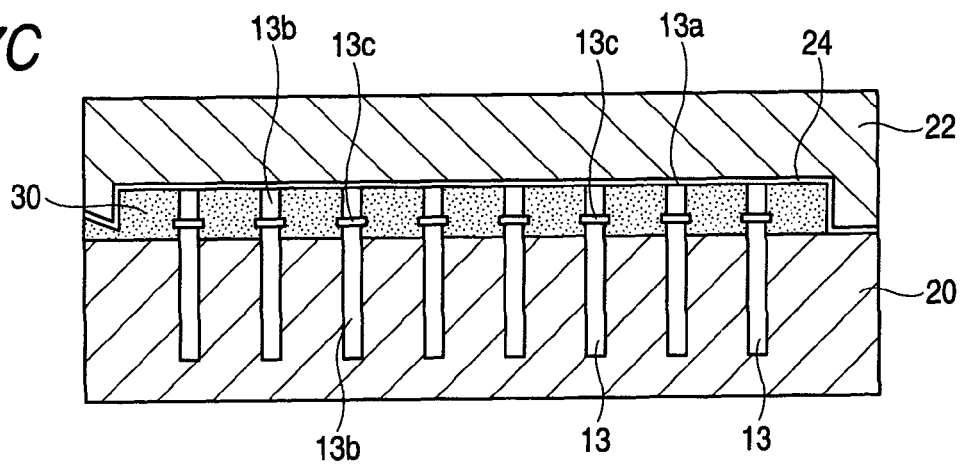

FIGS. 7A to 7C show a further manufacturing method of a substrate with pins. In each of the embodiments described above, the example of manufacturing the substrate with the pins by molding the pins comprising the head parts whose diameters are disposed larger than those of the shaft parts in one ends of the pins by the resin has been described. The present embodiment is characterized in that a substrate with pins is formed using a pin in which a head part is not formed in one end of the pin, so to speak, the whole pin is formed in the same diameter as that of a shaft part 13b.

The embodiment shown in FIGS. 7A to 7C is an example of forming a substrate 45 with pins by molding pins 13 in which flange-shaped projections 13c acting as locking parts are disposed in middle parts of the shaft parts 13b by a resin. As shown in FIG. 7A, a formation position of the projection 13c on the shaft part 13b is set so that the projection 13c is located in the portion upper than a resin molding surface 20a of a lower mold 20 in the case of setting the pins 13 in the lower mold 20 in which set holes 21 are formed.

As shown in FIG. 7B, a cavity 26 is formed by clamping by an upper mold 22 and the lower mold 20 so that upper end faces 13a of the shaft parts 13b abut on a film 24, and the cavity 26 is filled with a resin 30 from a molding gate 25. FIG. 7C shows a state of filling the cavity 26 with the resin 30.

Figure 8A:
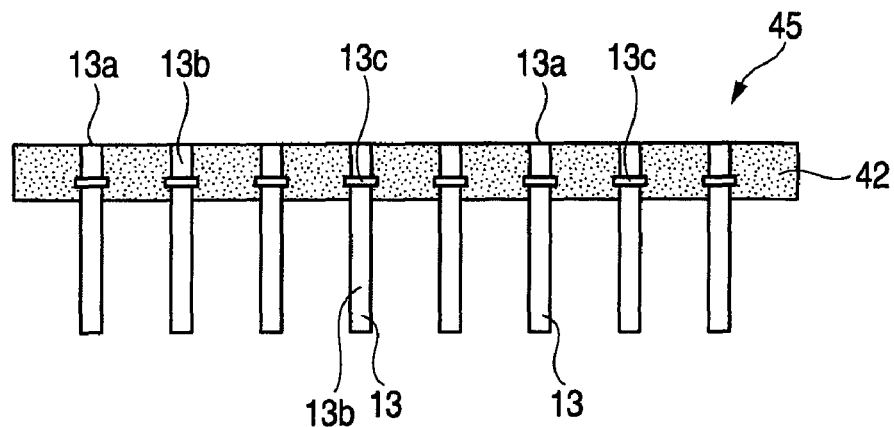
FIGS. 8A to 8C are sectional views showing further configurations of substrates with pins.

FIG. 8A is the substrate 45 with the pins obtained by molding the pins 13 by the resin. The upper end face 13a which is one end of the pin 13 is exposed flush with one surface (upper surface) of a resin substrate 42 and the projection 13c acting as the locking part formed in the middle part of the shaft part 13b sinks inside the resin substrate 42 and a resin is molded and the other end of the pin 13 extends from the other surface (lower surface) of the resin substrate 42. By burying the projection 13c in the resin substrate 42 and molding the resin, the pin 13 can be supported by being retained from the resin substrate 42 even when the pin 13 is formed in the same diameter as a whole.

Figure 8B:
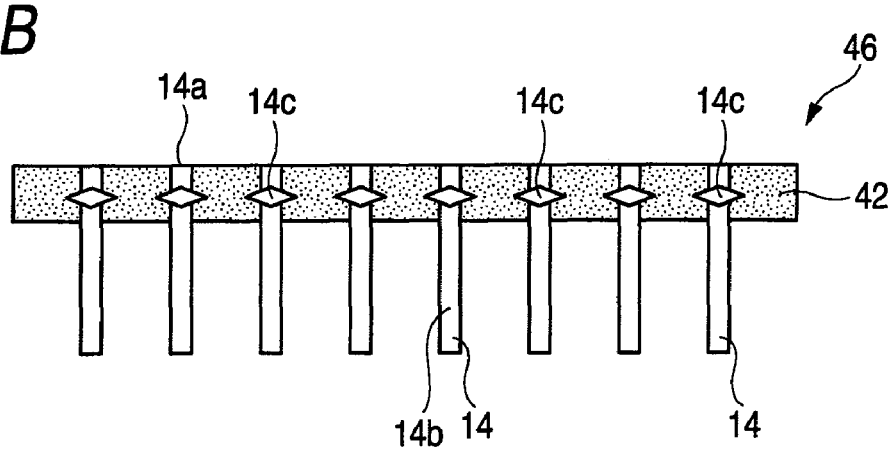
Figure 8C:
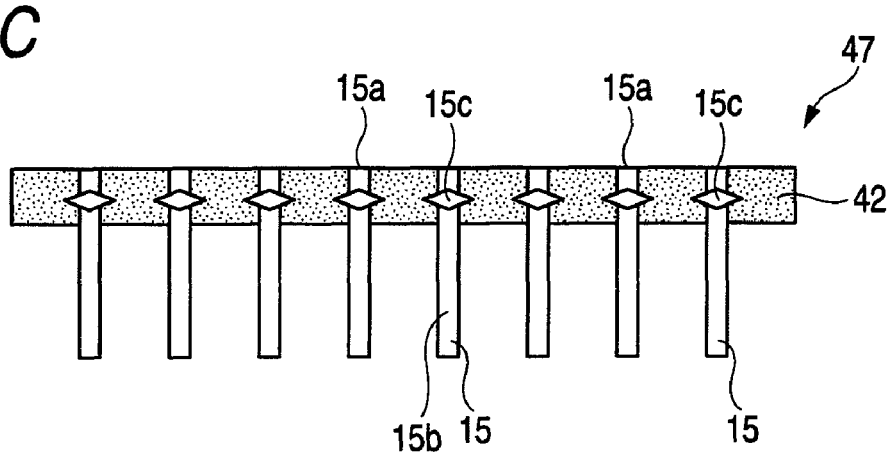

FIGS. 8B and 8C are examples of substrates 46, 47 with pins formed by molding pins 14, 15 in which the whole pins are formed in the same diameter by resins in a manner similar to FIG. 8A.

FIG. 8B is the example of disposing a projection 14c with a triangular sectional shape in a middle part of a shaft part 14b of the pin 14, and is the example in which the projection 14c is completely buried inside a resin substrate 42 and a resin is molded. FIG. 8C is the example of disposing a projection 15c with a triangular sectional shape in a middle part of a shaft part 15b of the pin 15, and is the example in which the projection 15c is aligned with a lower surface of a resin substrate 42 and a resin is molded. In both cases of FIGS. 8B and 8C, upper end faces 14a, 15a which are one ends of the pins 14, 15 are exposed flush with upper surfaces (surfaces of bonding to wiring substrates) of the resin substrates 42.

Figure 9A:
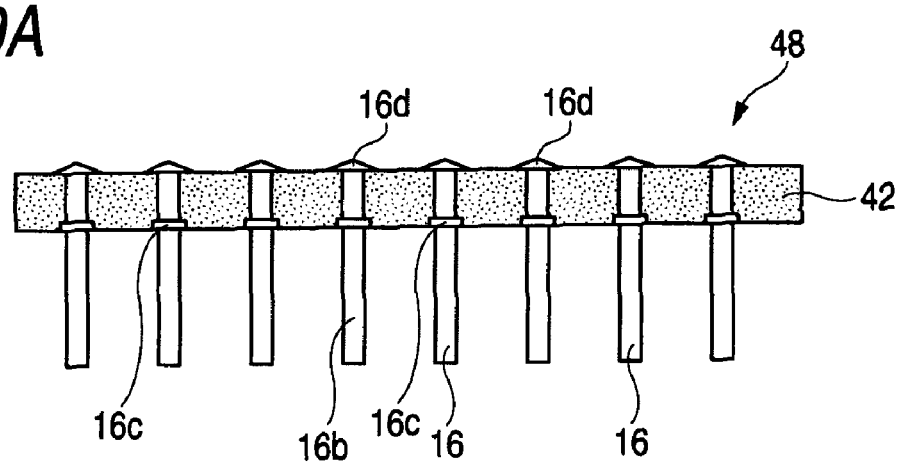
FIGS. 9A to 9C are sectional views showing further configurations of substrates with pins.
Figure 9B:
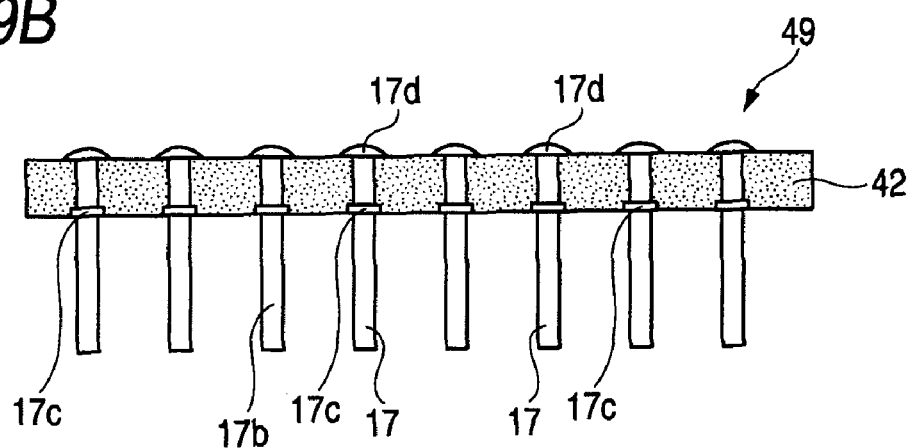
Figure 9C:
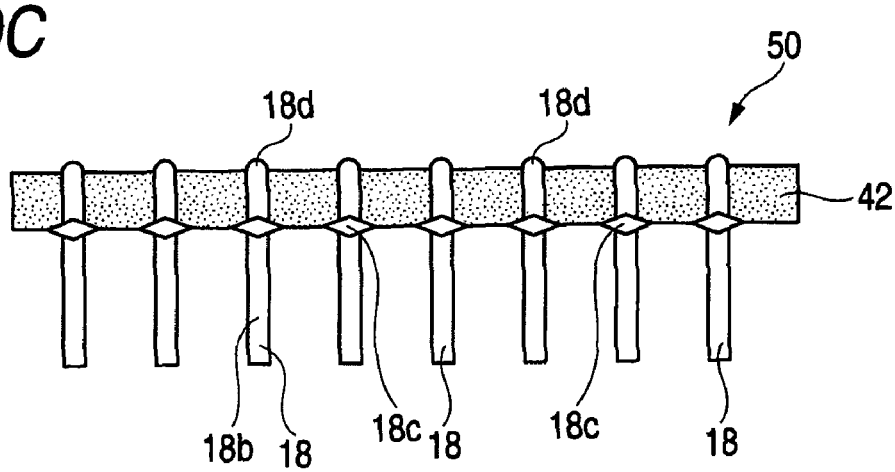

FIGS. 9A to 9C show examples of forming substrates 48, 49, 50 with pins using pins 16, 17, 18 having protrusion parts protruding from upper surfaces of resin substrates 42.

The substrate 48 with the pins shown in FIG. 9A is the example of forming the substrate 48 with the pins using the pins 16 in which circular conic connection projections 16d are disposed in one ends while flanges 16c are disposed in middle parts of shaft parts 16b. The flange 16c regulates the amount of protrusion of the pin from a lower mold in the case of molding the pin 16 by a resin, and prevents a resin burr from occurring on an outer surface of the shaft part 16b. The connection projection 16d is formed by a resin so that only a projection portion protrudes from the upper surface of the resin substrate 42.

Figure 10:
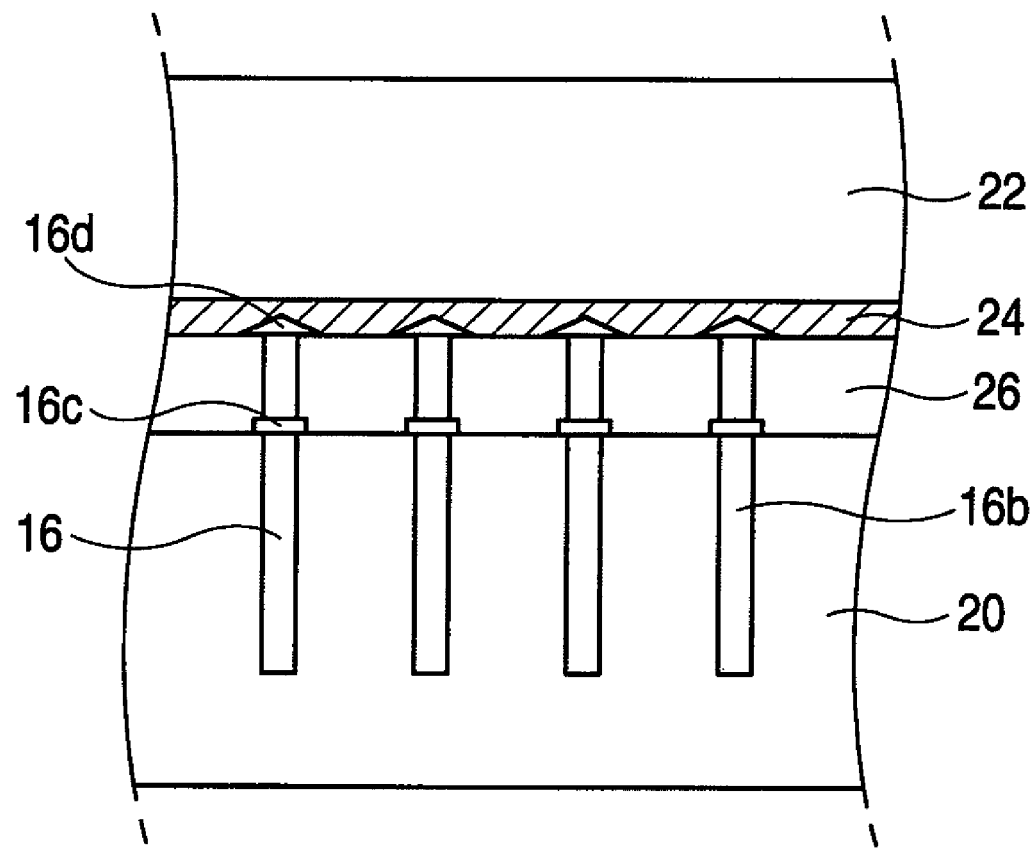
FIG. 10 is an explanatory view showing a manufacturing method of the substrate with the pins shown in FIG. 9A.

FIG. 10 shows a state of molding the substrate 48 with the pins by a resin using the pins 16 in which the connection projections 16d are disposed. By clamping the pins 16 by an upper mold 22 and a lower mold 20, the connection projections 16d of the pins 16 are pushed in a film 24 with which a resin molding surface of the upper mold 22 is covered and outer surfaces of the connection projections 16d are covered with the film 24 and in the case of filling a cavity 26 with a resin, the resin is prevented from infiltrating into the outer surfaces of the connection projections 16d and the resin is molded. Consequently, the resin is molded in a state in which the connection projections 16d protrude from an outer surface of the resin substrate 42 and the outer surfaces of the connection projections 16d are exposed without attaching the resin to the outer surfaces of the connection projections 16d. In this resin molding operation, the film 24 having a thickness and flexibility of the extent to which regions of the connection projections 16d are pushed is used.

FIG. 9B is the example of forming the substrate 49 with the pins using the pins 17 comprising connection projections 17d having spherical outer surfaces in the upper ends of shaft parts 17b as one ends of the pins 17. Also in this embodiment, the connection projections 17d can be protruded in a state of being exposed from the upper surface of the resin substrate 42 by molding a resin in a state in which the connection projections 17d are pushed in a film 24 and outer surfaces of the connection projections 17d are covered with the film 24 in the case of clamping the pins 17 by a lower mold 20 and an upper mold 22. Disposing flanges 17c in middle parts of shaft parts 17b of the pins 17 is similar to the embodiment shown in FIG. 9A. The other end of the pin 17 extends from a lower surface of the resin substrate 42.

FIG. 9C is the example of forming the substrate 50 with the pins using the pins 18 in which connection projections 18d are formed by processing upper ends of shaft parts 18b in spherical shapes as one ends of the pins 18. The connection projections 18d of the ends of the shaft parts 18b can be protruded in a state of being exposed from the upper surface of the resin substrate 42 by molding a resin so that the connection projections 18d of the pins 18 processed in the spherical shapes of the shaft parts 18b are covered with a film 24 in the case of clamping the pins 18 by a lower mold 20 and an upper mold 22 in a manner similar to the example described above.

In addition, the connection projection formed in one end of the pin 18 can be formed in a circular conic shape instead of being formed in the spherical shape.

Since the substrates with the pins shown in FIGS. 8A and 9C are formed using the pins in which the whole pins are made of the shaft parts with the same diameter, the pins can be arranged at a higher density than the case of using conventional pins comprising head parts whose diameters are formed larger than those of shaft parts. Consequently, the pins can be arranged at the higher density and it can cope with high-density arrangement of the pins and an increase in pins of a semiconductor device. Also, by molding a resin so as to dispose the projections etc. on the shaft parts of the pins and bury the projections in the resin substrate 42, the pins can be retained and attached to the resin substrate 42 and a bonding strength of the pins can be improved.

In addition, in the pin used in the substrates with the pins, copper, copper alloy, iron-nickel alloy, iron-nickel-cobalt alloy, etc. are used and a nickel plated layer/gold plated layer or a nickel plated layer/palladium plated layer/gold plated layer is previously disposed from the foundation layer side on an outer surface of a pin and the substrate with the pins is formed using the pins in which the outer surface of the pin is covered with the gold plated layer.

Also, in the embodiments described above, the example of molding one substrate with the pins by the resin by one cavity 26 has been shown, but plural substrates with pins are collectively molded by a resin by one cavity 26 and a large-sized resin molded product is molded and then the resin molded product is cut in one product unit and thereby, individual substrates with the pins can also be formed.

(Semiconductor Product)

The substrate with the pins described above is provided as a semiconductor package or a semiconductor device by being bonded to a wiring substrate.

Figure 11A:
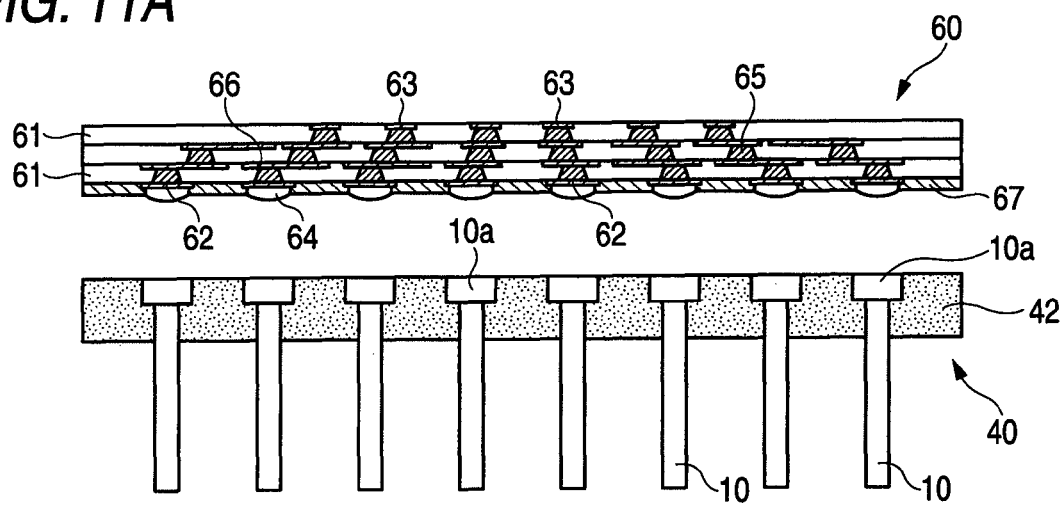
FIGS. 11A to 11C are explanatory views showing a manufacturing method of a semiconductor device.
Figure 11B:
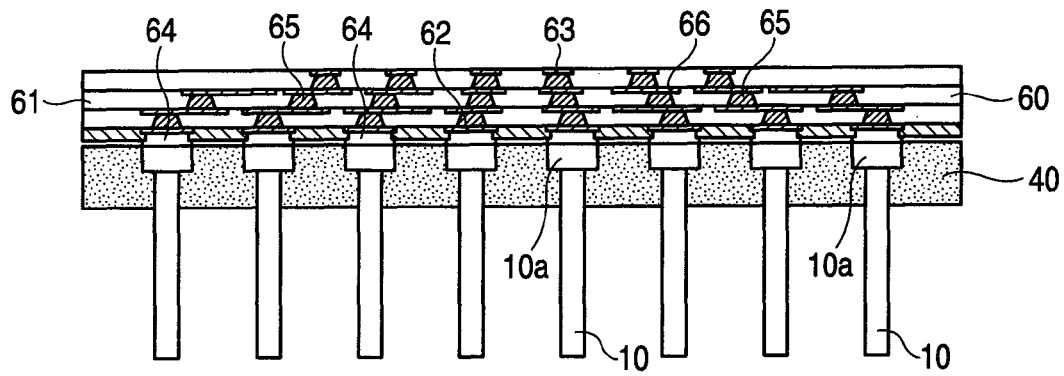
Figure 11C:
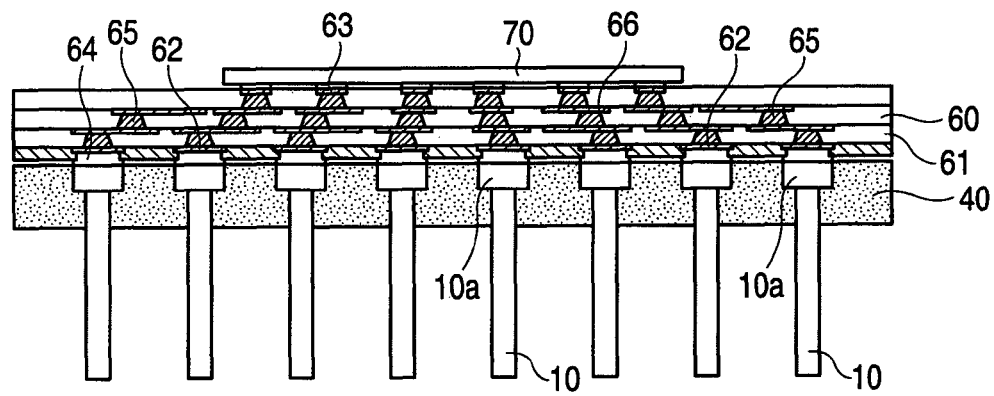

FIGS. 11A and 11C show a step of forming a semiconductor device by bonding the substrate 40 with the pins shown in FIG. 2 to a wiring substrate.

A wiring substrate 60 is formed by electrically connecting wiring patterns 66 between layers through vias 65 and stacking wiring layers and insulating layers 61. Pads 62 to which pins are connected are formed on a surface (lower surface), to which the substrate 40 with the pins is bonded, of the wiring substrate 60, and pads 63 for connecting a semiconductor element 70 are formed on an upper surface of the wiring substrate 60. A region in which the pads 63 of the wiring substrate 60 are formed is a semiconductor element mounting part. A solder resist 67 is formed on the lower surface of the wiring substrate 60 in a state that the pads 62 is exposed from the solder resist 67.

FIG. 11A shows a state in which solder pastes 64 are supplied to the pads 62 for pin connection of the wiring substrate 60 to which the substrate 40 with the pins is bonded and are aligned with the substrate 40 with the pins. Pins 10 are attached to the substrate 40 with the pins in the same plane arrangement as plane arrangement of the pads 62 for connection formed on the wiring substrate 60.

FIG. 11B shows a state in which the substrate 40 with the pins and the wiring substrate 60 are aligned using a jig etc. and are bonded by solder reflow. The pads 62 for connection formed on the wiring substrate 60 are in a one-to-one correspondence with head parts 10a of the pins 10 formed in the substrate 40 with the pins and the pins 10 attached to the substrate 40 with the pins are supported with the head parts 10a exposed to a bonding surface of a resin substrate 42, so that each of the pads 62 is surely bonded to each of the head parts 10a of the pins 10 by the solder reflow.

In addition, the solder pastes 64 may be supplied to the head parts 10a of the substrate 40 with the pins instead of the pads 62 and also, may be supplied to both of the pads 62 and the head parts 10a. Also, the substrate 40 with the pins may be bonded to the wiring substrate 60 by a conductive adhesive material instead of solder.

FIG. 11C shows a state of mounting the semiconductor element 70 on the wiring substrate 60 after the substrate 40 with the pins is bonded to the wiring substrate 60. FIG. 11C shows the state of mounting the semiconductor element 70 by flip chip connection. Of course, the semiconductor element 70 can be mounted by wire bonding.

In addition, the semiconductor element 70 may be mounted on the wiring substrate 60 after the substrate 40 with the pins is bonded to the wiring substrate 60 as described in the embodiment, or may be mounted on the wiring substrate 60 before the substrate 40 with the pins is bonded to the wiring substrate 60.

FIG. 11B is a semiconductor product as a semiconductor package in which the substrate 40 with the pins is bonded to the wiring substrate 60, and FIG. 11C is a semiconductor product as a semiconductor device in which the semiconductor element 70 is mounted on the semiconductor package.

The semiconductor product of the embodiment is provided as a pin grid array type semiconductor package or semiconductor device in which the pads 62 of the wiring substrate 60 are electrically connected to the pins 10 by bonding the substrate 40 with the pins to the wiring substrate 60.

The substrate 40 with the pins is formed by arranging the pins 10 in alignment with the pads 62 formed on the wiring substrate 60, and the wiring substrate 60 is formed in a form similar to a conventional wiring substrate comprising pads for pin connection.

Since the substrate 40 with the pins has predetermined shape retention for suppressing deformation of the wiring substrate 60, the wiring substrate 60 is reinforced by bonding the substrate 40 with the pins to the wiring substrate 60 and even for the wiring substrate 60 which tends to be deformed singly, it is provided as a semiconductor product which retains the shape and is supported by the substrate 40 with the pins and has a necessary strength and suppresses deformation. Also, by bonding the substrate 40 with the pins to the wiring substrate 60 and forming the semiconductor product, a bonding strength of each of the pins 10 attached to the substrate 40 with the pins also improves and a bonding strength sufficient to insert and withdraw a pin grid array type semiconductor product can be obtained.

Figure 14:
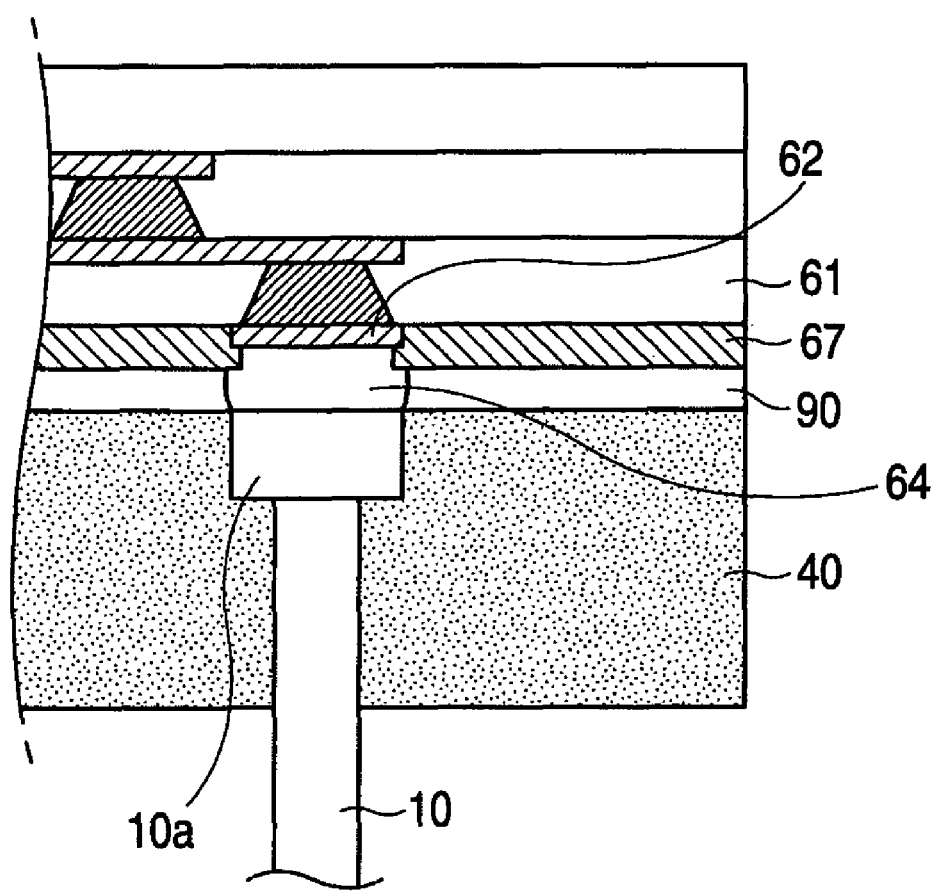
FIG. 14 is an explanatory view showing a modified manufacturing method of the semiconductor device shown in FIG. 11B.
Figure 15:
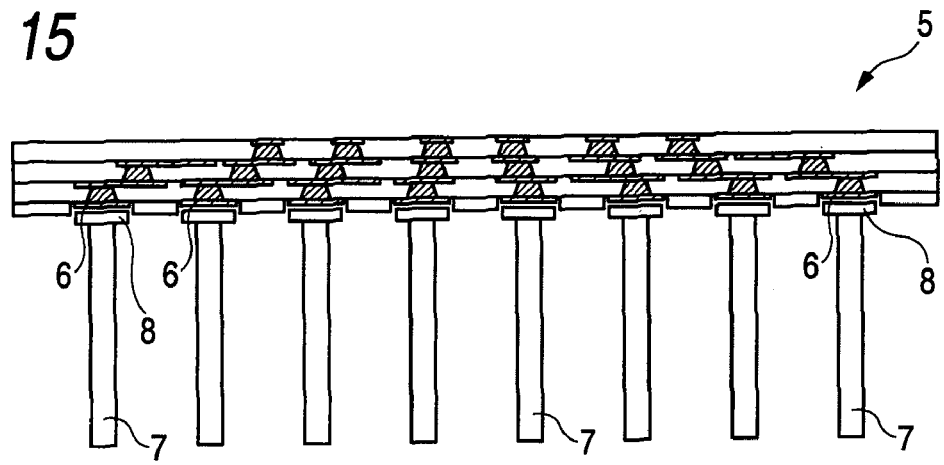
FIG. 15 is a sectional view showing a conventional configuration of a semiconductor product.
Figure 16A:
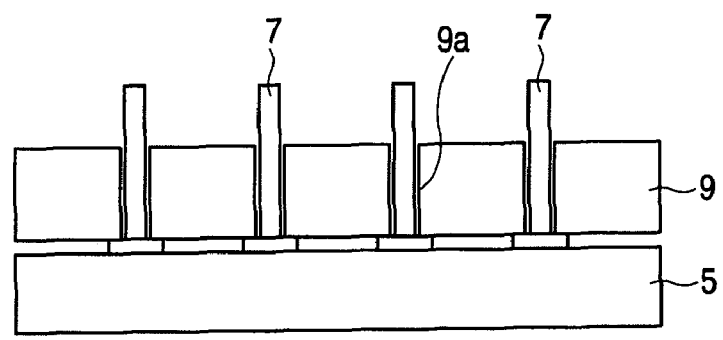
FIGS. 16A and 16B are explanatory views showing a step of bonding pins to a wiring substrate using a support jig.
Figure 16B:
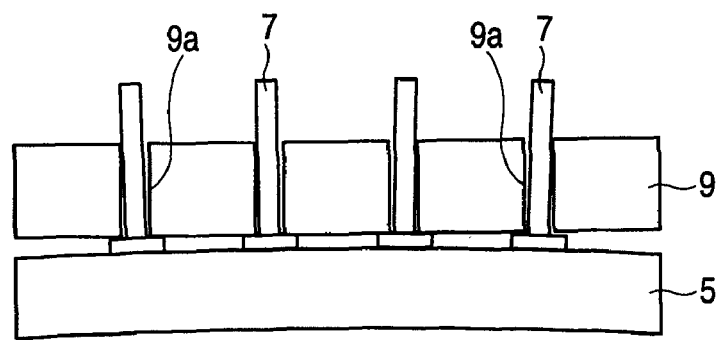

In addition, as shown in FIG. 14, after the substrate 40 with the pins is bonded to the wiring substrate 60 (FIG. 11B), a gap of the portion of bonding between the substrate 40 with the pins and the wiring substrate 60 may be filled with a resin 90 such as epoxy or polymide and the bonding portion is sealed with the resin and also the resin may be cured and the portion of bonding between the substrate 40 with the pins and the wiring substrate 60 can also be reinforced.

The configuration of the wiring substrate 60 constructing the semiconductor product according to the invention, for example, the manufacturing method of the wiring substrate 60 or the number of the wiring layers is not particularly limited, but it is particularly preferable to be applied to a thin coreless build-up substrate. A build-up substrate (Japanese Patent No. 3635219) in which plural wiring layers and insulating layers are formed on a support plate and then the support plate is removed and a wiring substrate is formed is preferably used as a coreless wiring substrate.

Figure 12A:
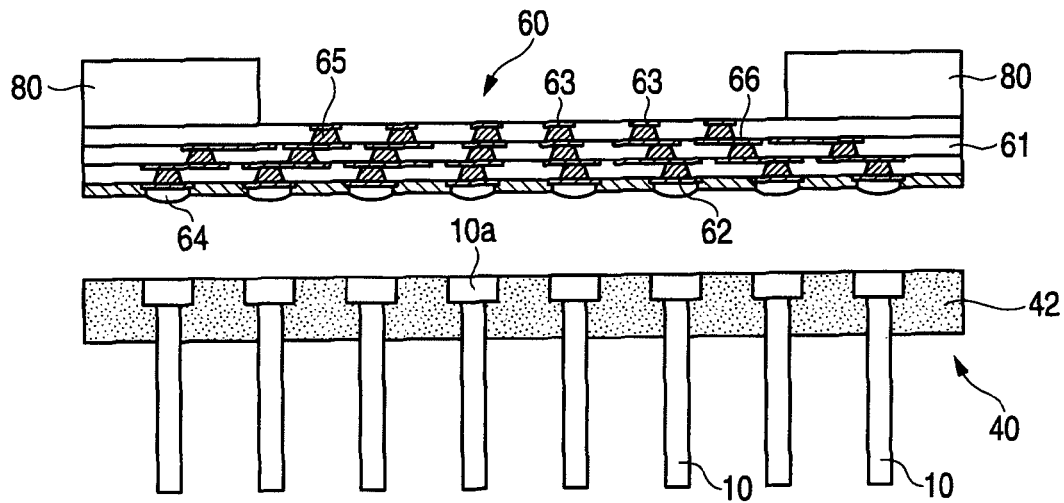
FIGS. 12A and 12B are explanatory views showing another manufacturing method of a semiconductor device.
Figure 12B:
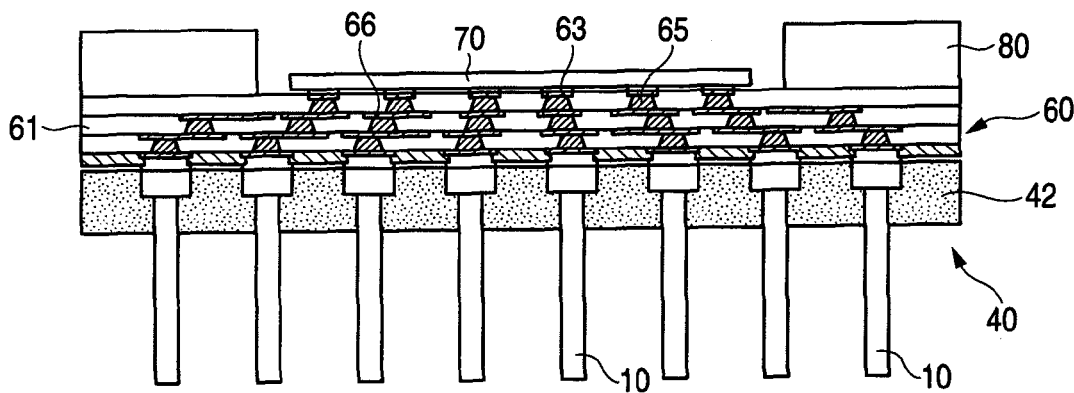

FIGS. 12A and 12B show an example of bonding a reinforcing material 80 to a surface (surface on which a semiconductor element is mounted) opposite to a surface, to which a substrate 40 with pins is bonded, of a wiring substrate 60 as a method constructed so that warping etc. do not occur in a semiconductor product by a difference between the substrate 40 with the pins and the wiring substrate 60 in a physical property value such as a thermal expansion coefficient in the case of bonding the substrate 40 with the pins to the wiring substrate 60. FIG. 12A shows a state before the substrate 40 with the pins is bonded to the wiring substrate 60 in which the reinforcing material 80 is bonded to a semiconductor element mounting surface, and FIG. 12B shows a state of bonding the substrate 40 with the pins to the wiring substrate 60 and mounting a semiconductor element 70.

The reinforcing material 80 is means for striking a balance of stress with the substrate 40 with the pins, and proper materials such as resin or metal, for example, the same resin material as a resin material constructing a resin substrate 42 of the substrate 40 with the pins can be used.

The reinforcing material 80 is formed in a frame shape in order to secure a region in which the semiconductor element 70 is mounted. In FIG. 12, the substrate 40 with the pins is bonded to the wiring substrate 60 after the reinforcing material 80 is bonded to the wiring substrate 60, but the reinforcing material 80 may be bonded to the wiring substrate 60 after the substrate 40 with the pins is bonded to the wiring substrate 60. Also, the reinforcing material 80 can be attached to the wiring substrate 60 by a method for molding a resin with respect to the wiring substrate 60.

Also, a method for selecting a resin material for molding used in the case of molding a substrate with pins by a resin and adjusting the amount of filling of a filler such as silica mixed in the resin material or selecting a used filler material can be used as a method for matching physical property values such as thermal expansion coefficients of the wiring substrate 60 and the substrate 40 with the pins.

In FIGS. 11 and 12, the example of bonding the substrate 40 with the pins shown in FIG. 2 as the substrate with the pins bonded to the wiring substrate 60 has been shown, but a semiconductor product can similarly be formed by bonding the substrates with the pins shown in FIGS. 4, 6, 8, 9 to the wiring substrate 60.

Figure 13:
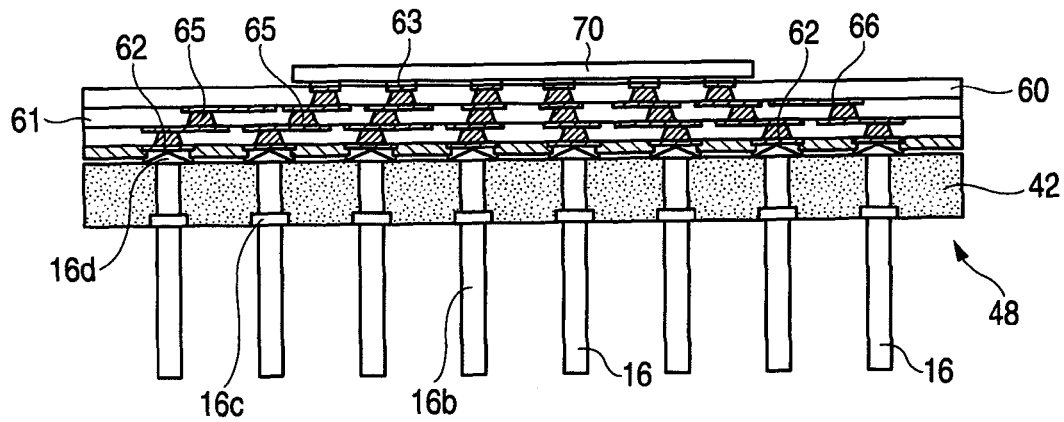
FIG. 13 is an explanatory view showing another configuration example of a semiconductor device.

FIG. 13 shows an example of forming a semiconductor device by bonding the substrate 48 with the pins shown in FIG. 9A to the wiring substrate 60. Since the substrate 48 with the pins comprises the pins 16 in which the connection projections 16d protruding from the upper surface of the resin substrate 42 are formed, positioning of the substrate 48 with the pins is facilitated by abutting the connection projections 16d on the pads 62 in the case of bonding the substrate 48 with the pins to the wiring substrate 60 and also, a bonding area by solder bonding between the connection projections 16d and the pads 62 increases by disposing the connection projections 16d and thereby, there is an advantage of improving a bonding strength of the pins 16. Also, an effect of void release at the time of solder bonding can be obtained by disposing the connection projections 16d.

Also, in the substrates 45, 46, 47, 50 with the pins shown in FIGS. 8 and 9C in which the whole pin is formed in the same diameter, a diameter of an end face of the pin is formed thinner than that of a pin comprising a head part, so that the pad 62 for connection formed on the wiring substrate 60 can also be formed with the diameter of the pad contracted and thereby, the pads 62 can be arranged at a high density.

Also, the substrate with the pins according to the invention is formed by erecting the pins in the resin substrate 42 formed by resin molding, so that the pins are surely supported by the resin substrate 42 and handling is easy.

Also, in the case of molding a resin, pins are accurately aligned by a lower mold and an upper mold and the resin is molded, so that heights of the pins can be equalized and the pins can accurately be arranged with inclinations of the pins suppressed. Consequently, the pins can be arranged at a narrow pitch.

Also, by supporting the pins in the resin substrate 42, the pins do not move even when a brazing material melts in the case of bonding the substrate with the pins to the wiring substrate in a post-step and therefore, a kind of solder (a kind of conductive material) used in a solder reflow step is not restricted and the substrate with the pins can be bonded to the wiring substrate easily and surely.

In addition, in the manufacturing step of the semiconductor products shown in FIGS. 11A to 13, the semiconductor element 70 has been mounted on the surface on which the pads 63 of the wiring substrate 60 are formed, but the formation surface side of pads 32 in which a solder resist 67 is deposited can be used as a mounting surface of the semiconductor element 70 and the surface side on which the pads 63 are formed can be used as a bonding surface to which the substrate with the pins is bonded. Also, pads for bonding pins and pads (electrodes) for mounting the semiconductor element 70 are disposed on one surface of the wiring substrate 60 and a substrate with pins is formed in a frame shape in which a mounting hole for mounting the semiconductor element 70 is formed in the center and the substrate with the pins is bonded to one surface of the wiring substrate 60 and the semiconductor element can be mounted. That is, the substrate with the pins can also be formed by molding a resin substrate in the frame shape. Thus, the substrate with the pins can be formed in a proper plane shape.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A semiconductor product comprising:
a wiring substrate having a pad for pin connection; and
a substrate having a resin substrate formed by resin molding, and a pin disposed in the resin substrate, the pin having one end exposed to one surface of the resin substrate and bonded to the pad of the wiring substrate through a conductive material and the other end extending from the other surface of said resin substrate,
wherein a head part whose diameter is formed larger than a diameter of a shaft part of the pin is formed at said one end of the pin.

2. A semiconductor product as claimed in claim 1, wherein the semiconductor product is constructed as a semiconductor device in which a semiconductor element is mounted on the wiring substrate.

3. A semiconductor product as claimed in claim 1, wherein the semiconductor product is constructed as a semiconductor package in which a semiconductor element mounting part is disposed in the wiring substrate.

4. A semiconductor product as claimed in claim 1, wherein said one end of the pin is formed flush with said one surface of the resin substrate.

5. A semiconductor product as claimed in claim 1, wherein said one end of the pin protrudes from said one surface of the resin substrate.

6. A semiconductor product as claimed in claim 1, wherein a locking part is formed in a middle part of a shaft part of the pin and the locking part is buried in the resin substrate.

7. A semiconductor product comprising:
a wiring substrate having a pad for pin connection; and
a substrate having a resin substrate formed by resin molding, and a pin disposed in the resin substrate, the pin having one end exposed to one surface of the resin substrate and bonded to the pad of the wiring substrate through a conductive material and the other end extending from the other surface of said resin substrate,
wherein a connection projection is formed at said one end of the pin.

8. A semiconductor product comprising:
a wiring substrate having a pad for pin connection;
a substrate having a resin substrate formed by resin molding, and a pin disposed in the resin substrate, the pin having one end exposed to one surface of the resin substrate and bonded to the pad of the wiring substrate through a conductive material and the other end extending from the other surface of said resin substrate; and
a reinforcing material disposed on a surface opposite to a surface, to which the substrate is bonded, of the wiring substrate.

9. A substrate, comprising:
a resin substrate formed by resin molding;
a pin disposed in the resin substrate, the pin having one end exposed to one surface of the resin substrate and the other end extending from the other surface of the resin substrate,
wherein a head part whose diameter is formed larger than a diameter of a shaft part of the pin is formed at said one end of the pin, and the head part is formed flush with said one surface of the resin substrate.

10. A substrate as claimed in claim 9, wherein a locking part is formed in a middle part of a shaft part of the pin and the locking part is buried in the resin substrate.

* * * * *